United States Patent
Miyatake

(10) Patent No.: US 7,663,683 B2
(45) Date of Patent: Feb. 16, 2010

(54) SOLID STATE IMAGE SENSING DEVICE WHICH PERFORMS A LINEAR CONVERSION OPERATION AND A LOGARITHMIC CONVERSION OPERATION

(75) Inventor: Shigehiro Miyatake, Osaka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 380 days.

(21) Appl. No.: 11/879,699

(22) Filed: Jul. 17, 2007

(65) Prior Publication Data
US 2008/0018766 A1 Jan. 24, 2008

(30) Foreign Application Priority Data
Jul. 18, 2006 (JP) .............................. 2006-196041

(51) Int. Cl.
*H04N 5/335* (2006.01)
(52) U.S. Cl. .......................... 348/308; 348/300; 348/302
(58) Field of Classification Search ................. 348/300, 348/301
See application file for complete search history.

(56) References Cited

U.S. PATENT DOCUMENTS

| | | | |
|---|---|---|---|
| 6,967,682 B1 * | 11/2005 | Hagihara | 348/308 |
| 7,030,921 B2 * | 4/2006 | Hagihara et al. | 348/308 |
| 7,399,951 B2 * | 7/2008 | Morimoto et al. | 250/208.1 |
| 7,486,322 B2 * | 2/2009 | Shinotsuka et al. | 348/308 |
| 2005/0151867 A1 * | 7/2005 | Goto et al. | 348/302 |

FOREIGN PATENT DOCUMENTS

| | | |
|---|---|---|
| JP | 2836147 B2 | 10/1998 |
| JP | 2002-300476 A | 10/2002 |
| JP | 3664035 B2 | 4/2005 |
| JP | 2006-50544 A | 2/2006 |

* cited by examiner

*Primary Examiner*—Luong T Nguyen
(74) *Attorney, Agent, or Firm*—Sidley Austin LLP

(57) ABSTRACT

A solid state image sensing device includes an MOS transistor T2 that has a source thereof connected to a drain of an MOS transistor T1 being provided with a transfer gate which is connected to an embedded photodiode PD; an MOS transistor T5 that has a gate thereof connected to the drain of the MOS transistor T1; and a condenser that has a source thereof connected to the MOS transistor T5. When a linear conversion operation is performed in an entire range of luminance, the MOS transistor T2 works, serving as a switch for resetting, and at least when a logarithmic conversion operation is performed in a part of the range of luminance, the MOS transistor T2 works in a sub-threshold region.

4 Claims, 14 Drawing Sheets

SOLID STATE IMAGE SENSING DEVICE WHICH PERFORMS A LINEAR CONVERSION OPERATION AND A LOGARITHMIC CONVERSION OPERATION

This application is based on the Japanese Patent Application No. 2006-196041 being filed on Jul. 18, 2006, the entire contents of which are hereby incorporated by reference.

BACKGROUND OF THE INVENTION

1. Field of the Invention

The present invention relates to a solid state image sensing device including pixels that produce electric signals corresponding to incident light. In particular, the present invention relates to a solid state image sensing device including pixels each of which consists of transistors.

2. Description of the Prior Art

Solid state image sensing devices that are used for various applications can be classified into two main types according to a method to read out/take out photo-charges that are generated in photoelectric conversion elements: CCD type of solid state image sensing devices and CMOS type of solid state image sensing devices: The CCD type of solid state image sensing devices transfer the photo-charges while storing them in potential wells, thereby making a dynamic range thereof narrow, which is disadvantageous to the CCD type of solid state image sensing devices. On the other hand, the CMOS type of solid state image sensing devices directly read out the photo-charges, which are stored in a "pn" junction capacitance of a photodiode, by way of an MOS transistor.

In addition, one of conventional CMOS types of solid state image sensing devices performs a logarithmic conversion operation which converts an amount of incident light by a logarithmic conversion. (See the U.S. Pat. No. 2,836,147.) This solid state image sensing device has a wide dynamic range having five to six digits. Therefore, although an image of a subject having a luminance distribution of a slightly wide range of luminance is sensed, the solid state image sensing device can convert entire luminance information in the luminance distribution into an electric signal so as to be outputted. However, since a region where image sensing is possible becomes larger than the luminance distribution of a subject of an image sensing, there may be generated such an area as has no luminance data in a low luminance range or a high luminance range within the region where the image sensing is possible.

The present applicant has disclosed such a CMOS type of solid state image sensing device as can switch over between a logarithmic conversion operation and a linear conversion operation that are mentioned above. (See the U.S. Pat. No. 3,664,035.) In addition, in order to automatically switch over between the linear conversion operation and the logarithmic conversion operation, the present applicant has disclosed such a CMOS type of solid state image sensing device as sets a potential state of a transistor being connected to a photodiode performing a photoelectric conversion operation to be in an appropriate state. (See the Japanese Patent Application No. 2002-300476.) A solid state image sensing device in accordance with the Japanese Patent Application No. 2002-300476 can change over an inflection point, at which the photoelectric conversion operation is switched over from a linear conversion operation to a logarithmic conversion operation, by changing a potential state of a transistor.

Additionally, in order to reduce dark currents of a solid state image sensing device, such a solid state image sensing device is disclosed as employs an embedded photodiode. (See the Japanese Patent Application 2006-050544.) A solid state image sensing device in accordance with the Japanese Patent Application 2006-050544 comprises an embedded photodiode PD that serves as a photosensitive element; an MOS transistor T1 that has a source thereof connected to a cathode of the embedded photodiode PD; an MOS transistor T2 that has a source thereof connected to a drain of the MOS transistor T1; an MOS transistor T3 that has a gate thereof connected to a connection node between the drain of the MOS transistor T1 and the source of the MOS transistor T2; and an MOS transistor T4 that has a drain thereof connected to the source of the MOS transistor T3.

Then, a direct current voltage VPS is applied to an anode of the photodiode PD and back gates of the MOS transistors T1 through T4, and direct current voltages VRS and VPD are applied to the drains of the MOS transistors T2 and T3, respectively. In addition, signals $\phi TX$, $\phi RS$ and $\phi V$ are supplied to the gates of the MOS transistors T1, T2 and T4, respectively, and an output signal line 14 is connected to the source of the MOS transistor T4. Moreover, the MOS transistors T1 through T4 are N-channel MOS transistors.

As shown in FIG. 19, a pixel being constructed as described hereinabove comprises an embedded photodiode PD that is constructed by forming a P type layer 20 on a surface of a P type well layer 31 being formed on a P-type substrate 30 so as to have an N type embedded layer 21 buried therein; a transfer gate TG that is provided with a gate electrode 23 being constructed by way of an insulation film 22 on a surface of a region neighboring a region where the embedded photodiode PD is constructed; an N type floating diffusion layer FD that is formed in a region neighboring a region where the transfer gate TG is constructed; a reset gate RG that is provided with a gate electrode 25 being constructed by way of an insulation film 24 on a surface of a region neighboring the N type floating diffusion layer FD; and an N type diffusion layer D that is formed in a region neighboring a region where the reset gate RG is constructed.

In the above-mentioned condition, a P type layer 20 of high density is formed on a surface of the N type embedded layer 21 in the embedded photodiode PD. In addition, the MOS transistor T1 comprises an N type embedded layer 21, an N type floating diffusion layer FD, and a transfer gate TG; and the MOS transistor T2 comprises an N type floating diffusion layer FD, an N type diffusion layer D, and a transfer gate RG. Then, by having an embedded photodiode PD constructed in a pixel in such a manner as described hereinabove, a potential on a surface of the P type layer 20 is fixed to a potential which is same as a potential of a channel stopper layer that consists of a the P type layer surrounding the embedded photodiode PD. Moreover, the N type floating diffusion layer FD has the gate of the MOS transistor T3 connected thereto.

By having a configuration of a circumference of the embedded photodiode PD constructed so as to achieve a configuration as shown in FIG. 19, it is possible to suppress dark currents that are generated on a surface of the circumference of the embedded photodiode PD and to reduce dark currents that are generated in a pixel. In addition, in a signal output circuit which is installed in a subsequent stage of a pixel, a correlation double sampling method can be employed, and thereby, noises can be eliminated. Due to the above-mentioned effects, a solid state image sensing device employing an embedded photodiode PD is expected to be a dominant solid state image sensing device of low noise and high sensitivity.

In addition, in a pixel having such components as shown in FIG. 19, by having a gate voltage of a gate electrode 23 determining a potential state in a transfer gate TG become a midpoint potential, it is possible to switch over an operation between a linear conversion operation that changes an electric signal in a linear manner for an amount of incident light and a logarithmic conversion operation that changes an electric signal in a logarithmic manner for an amount of incident light. FIG. 20A shows a relation of potentials among an embedded photodiode PD, a transfer gate TG and an N type floating diffusion layer FD in a pixel in the above-mentioned condition.

When a light falls on the embedded photodiode PD, a photo-charge is generated. Therefore, the potential of the embedded photodiode PD decreases in accordance with photo-charges that are generated. At this time, when a luminance of a subject of image sensing is low, the potential appearing to the embedded photodiode PD becomes proportional to an integration value of the amount of incident light in a linear manner. Additionally, when a luminance of a subject of image sensing is high, the potential of the embedded photodiode PD becomes low; and when a difference thereof from the potential of the transfer gate TG comes close to a threshold value, the control gate TG works in a sub-threshold region, whereby an electric current flows from the embedded photodiode PD. Then, as shown in FIG. 20A, the potential appearing to the embedded photodiode PD varies so as to be proportional to a logarithmic value of an electric current that is generated by a photoelectric conversion.

When the potential of the embedded photodiode PD varies in accordance with the amount of incident light as described hereinabove, by setting a gate voltage of the gate electrode 23 to be at a low level, the potential of the transfer gate TG comes to take a low value as shown in FIG. 20B, and thereby, the potential of the embedded photodiode PD is maintained as shown in FIG. 20B. After that, a voltage of the potential of the embedded photodiode PD being maintained is transferred to the N type floating diffusion layer FD by way of the transfer gate TG, and additionally, an electric signal due to the voltage being transferred is outputted as an image signal.

However, in a solid state image sensing device including a pixel having a configuration as shown in FIG. 18, in a case where an image signal is produced by having a linear conversion operation performed, a photo-charge that is generated in the photodiode PD by the incident light is stored, and an image signal that is integrated is outputted even though an integrating circuit is not provided therein. On the other hand, in a case where an image signal is produced by having a logarithmic conversion operation performed, an image signal corresponding to a value at a moment when the MOS transistor T1 is turned off is outputted, in spite of a change in the amount of incident light during a period of exposure. As described hereinabove, an image signal that is integrated and converted in a linear manner or an image signal that is converted in a logarithmic manner without being integrated is outputted from a pixel having a configuration shown in FIG. 18. Therefore, compared with a signal at the time of a linear conversion operation having an integrating constituent, a degree of variability of a signal is high, and it is easy to receive effects of noises.

In consequence, at the time of a long-time exposure and the time of a speed light photography when a change in the incident light is likely to occur, there arises a problem that an information on a subject of image sensing cannot be obtained correctly in a case where an image signal being converted in a logarithmic manner is produced, like a case where the luminance of a subject of image sensing is high. In addition, in a case where the image signal being converted in a logarithmic manner is produced, there arises a problem that a flicker occurs for a luminance fluctuation of an illumination.

SUMMARY OF THE INVENTION

In view of conventionally experienced problems as described hereinabove, an object of the present invention is to provide a solid state image sensing device which attains low noise and high sensitivity by performing an integral operation, and which is provided with a wide dynamic range by performing a logarithmic conversion operation.

In order to achieve the above-mentioned object, a solid state image sensing device in accordance with the present invention comprises a plurality of pixels comprising: a photoelectric conversion element that generates a photo-charge in accordance with an amount of an incident light and stores a generated photo-charge therein; a charge-holding portion that has a photo-charge transferred from the photoelectric conversion element so as to hold it temporarily; a transfer gate that is formed between the photoelectric conversion element and the charge-holding portion; a first transistor that has a first electrode thereof connected to the charge-holding portion, has a second electrode thereof applied with a direct current voltage, and has a control electrode thereof provided with a first control signal that can change over among three voltage levels; a second transistor that is provided with a first electrode, a second electrode and a control electrode and has a control electrode thereof connected to the charge-holding portion; a third transistor that has a second electrode thereof connected to a first electrode of the second transistor, has a first electrode thereof applied with a direct current voltage, and has a control electrode thereof provided with a second control signal that can change over among three voltage levels; a capacitive element that has one end thereof connected to a first electrode of the second transistor; wherein, a first state is a state in which by setting the second control signal to be at an intermediate voltage level, thereby employing the third transistor as a constant current load, an electric signal which changes in a linear manner in accordance with an integration value of an amount of incident light in an entire range of luminance is outputted from the pixel; and a second state is a state in which by setting the first control signal to be at an intermediate voltage level, thereby operating the first and the second transistors in a sub-threshold region, an electric signal which changes in a natural logarithmic manner in accordance with an integration value of an amount of incident light at least in a part of a range of luminance is outputted from the pixel.

In accordance with the present invention, since in a first state in which a linear conversion operation is performed in an entire range of luminance, the third transistor is set to have a constant current load, a capacitive element can be utilized as a sample-hold element, so that such an electric signal outside thereof can be produced as varies in a linear manner in accordance with an integration value of the amount of incident light being provided from the second transistor. In addition, at least in a second state in which a logarithmic conversion operation is performed in a part of a range of luminance, by having the first and the second transistors operate in the sub-threshold region so as to have the capacitive element perform an integrating operation, the capacitive element can sample and hold an electric signal that varies in a logarithmic manner in accordance with the integration value of the amount of incident light.

In consequence, since the above-mentioned first and the second states can be easily selected and specified for each frame, the dynamic range thereof can be set widely. In addition, since in either of the above-mentioned first and the second states, an electric signal being integrated is outputted, a noise being generated in an electric signal can absorbed. As

DESCRIPTION OF THE PREFERRED EMBODIMENTS

Figure 1:
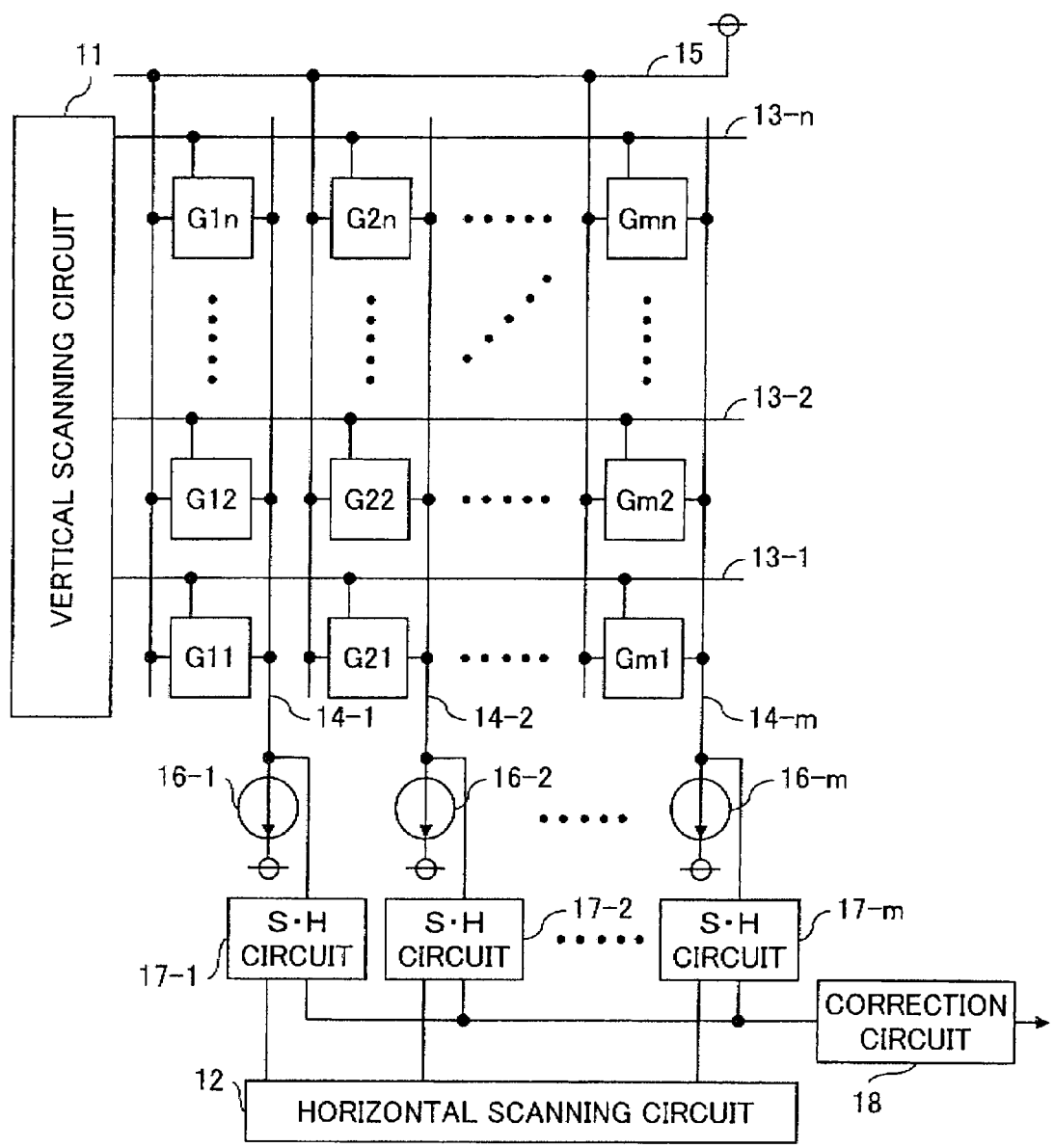
FIG. 1 is a block diagram showing a configuration of a solid state image sensing device in accordance with an embodiment of the present invention.

Referring now to the drawings, an embodiment of the present invention will be described hereinafter.

[Configuration of a Solid State Image Sensing Device]

First of all, a solid state image sensing device in accordance with the present embodiment will be described by referring to FIG. 1. FIG. 1 shows schematically a part of configuration of a two-dimensional CMOS type solid state image sensing device in accordance with an embodiment of the present invention.

In FIG. 1, reference symbols G11 through Gmn indicate pixels that are arranged in rows and column (in a matrix arrangement). Reference number 11 denotes a vertical scanning circuit that scans sequentially lines 13-1, 13-2 through 13-$n$ so as to provide each pixel with a signal $\phi$V. Reference number 12 denotes a horizontal scanning circuit that reads out sequentially in a horizontal direction, for each pixel, a photoelectric conversion signal being supplied from pixels to output signal lines 14-1, 14-2 through 14-$m$. Reference number 15 denotes a power source line. Not only the above-mentioned lines 13-1 through 13-$n$, the output signal lines 14-1 through 14-$m$ and the power source line 15 but also other lines, such as a clock line, a bypass supply line and the like, are connected to each pixel, all of which are omitted in FIG. 2.

In addition, the output signal lines 14-1 through 14-$m$ have constant current sources 16-1 through 16-$m$ connected thereto, respectively, and are provided with sample-hold circuits 17-1 through 17-$m$, respectively, that sample and hold each of signals being outputted from the pixels G11 through Gmn by way of each of the output signal lines 14-1 through 14-$m$. Then, when each of the signals being sampled and held in the sample-hold circuits 17-1 through 17-$m$ is provided to a correction circuit 18, the correction circuit 18 performs a correction process, so that an image signal having a noise eliminated is provided outside thereof. In addition, a direct current voltage VPS is applied to one end of constant current sources 16-1 through 16-$m$.

In a solid state image sensing device as described hereinabove, an image signal and a noise signal that are outputted from a pixel Gab (A reference sign "a" denotes a natural number that satisfies an inequality of $1 \leq a \leq m$; and a reference sign "b" denotes a natural number that satisfies an inequality of $1 \leq b \leq n$.) are provided, respectively, by way of an output signal line 14-$a$, and are amplified by a constant current source 16-$a$ being connected to the output signal line 14-$a$. Then, the image signal and the noise signal that are outputted from the pixel Gab are transmitted from a sample-hold circuit 17-$a$ sequentially, and in the sample-hold circuit 17-$a$, the image signal and the noise signal that are outputted are sampled and held.

Subsequently, after the image signal that is sampled and held in the sample-hold circuit 17-$a$ is outputted to the correction circuit 18, the noise signal that is sampled and held in the same manner is outputted to the correction circuit 18. In the correction circuit 18, the image signal that is provided from the sample-hold circuit 17-$a$ is corrected based on the noise signal that is provided from the sample-hold circuit. Then, the image signal having a noise eliminated by the noise signal in the correction circuit 18 is provided outside of the solid state image sensing device.

In addition, in a solid state image sensing device as described hereinabove, by having a signal provided to a vertical scanning circuit 11 from a signal controlling portion which is not illustrated herein, a signal for setting a timing to close a transfer gate of a pixel in each line and a signal for setting a timing for pixels G11 through Gmn to start an image sensing operation as well as a timing to output an image signal and a noise signal are provided by the vertical scanning circuit 11. Moreover, by having a signal provided to a horizontal scanning circuit 12 from the signal controlling portion which is not illustrated herein, a signal for setting a timing to output an image signal and a noise signal from the sample-hold circuits 17-1 through 17-$m$ to the correction circuit 18 is provided by the horizontal scanning circuit 12.

[Configuration of a Pixel]

Figure 2:
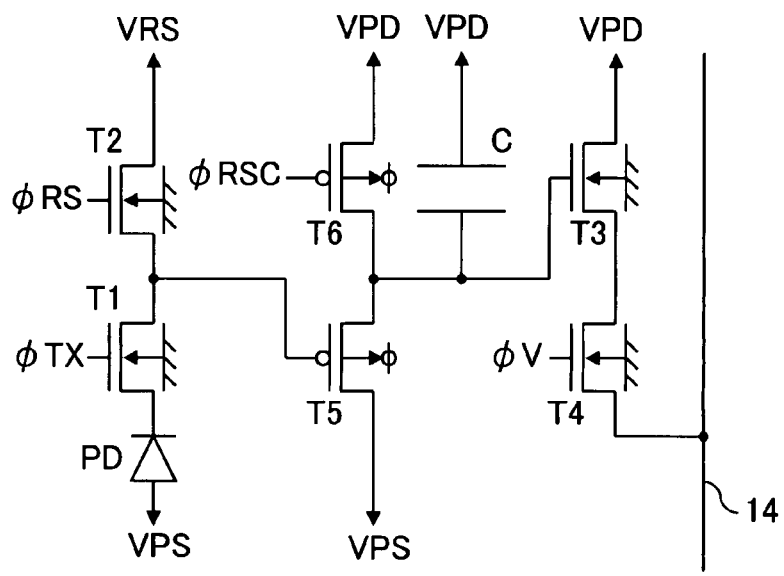
FIG. 2 is a circuit diagram showing a configuration of a pixel being provided to the solid state image sensing device shown in FIG. 1.

FIG. 2 shows a configuration of each pixel that is provided to a solid state image sensing device having a configuration shown in FIG. 1. In addition, in a configuration of a pixel shown in FIG. 2, same portions as those of a configuration of a pixel shown in FIG. 18 will be provided with same symbols, and detailed explanation thereof will be omitted.

Figure 18:
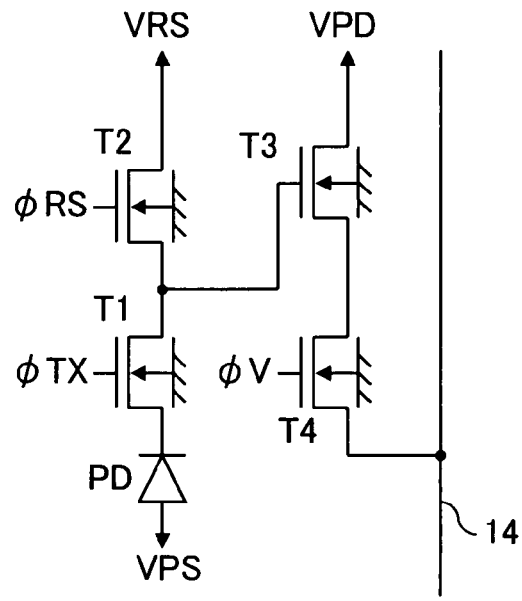
FIG. 18 is a circuit diagram showing a configuration of a pixel which is provided to a conventional solid state image sensing device.

Same as a pixel shown in FIG. 18, a pixel shown in FIG. 2 comprises an embedded photodiode PD; an MOS transistor T1 that has a source thereof connected to a cathode of the embedded photodiode PD; an MOS transistor T2 that has a source thereof connected to a drain of the MOS transistor T1; an MOS transistor T4 that has a source thereof connected to an output signal line 14; and an MOS transistor T3 that has a source thereof connected to a drain of the MOS transistor T4.

Figure 19:
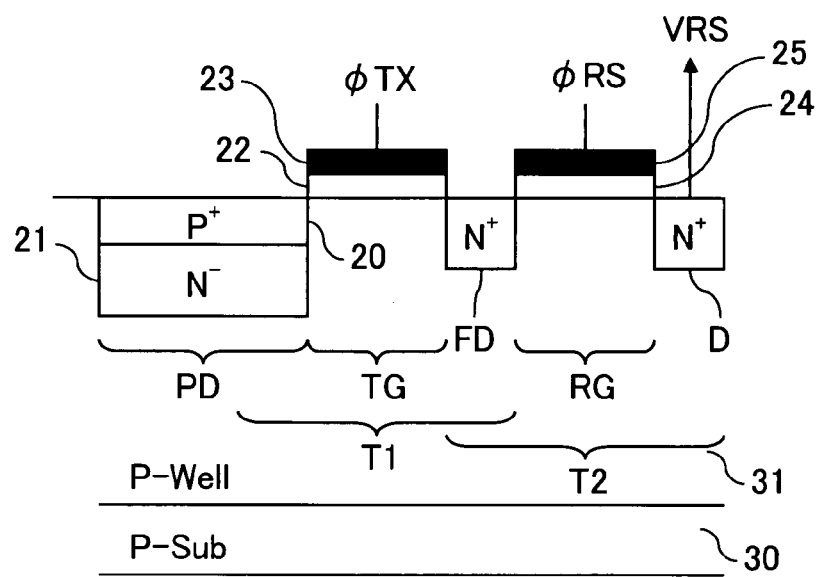
FIG. 19 is a schematic block diagram showing a configuration of a pixel.
Figure 20A:
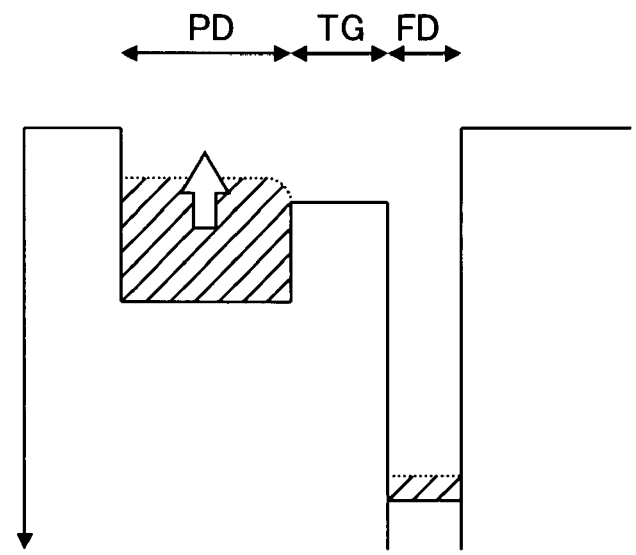
FIGS. 20A and 20B are diagrams showing a state of a potential of each channel in a pixel which is provided to a conventional solid state image sensing device.
Figure 20B:
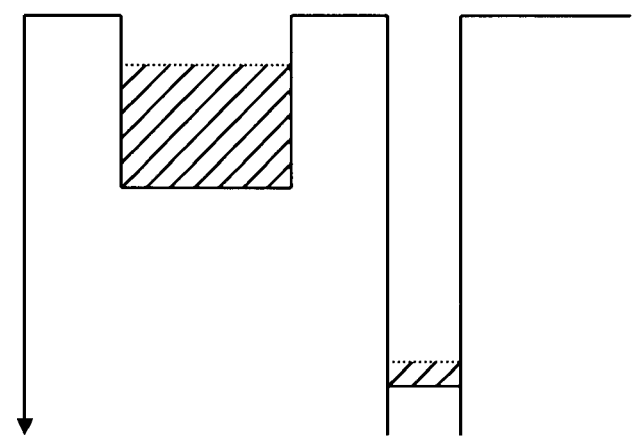

Then, as shown in FIG. 19, the embedded photodiode PD comprises a P tye well layer 31 being formed on a P type substrate 30; a P type layer 20 of high density being formed on a surface of the P type well layer 31; and an N type bedded layer 21. By having an embedded photodiode PD provided inside a pixel as described hereinabove, a potential on a surface of the P type layer 20 is fixed to a potential that is same as a potential of a channel stopper layer consisting of the P type layer surrounding the embedded photodiode PD. In addition, the MOS transistor T1 comprises an N type embedded layer 21; a transfer gate TG that is provided with a gate electrode 23 being constructed, by way of an insulation film 22, on a surface of a region neighboring a region in which the embedded photodiode PD is constructed; and an N type floating diffusion layer FD. Moreover, the MOS transistor T2 comprises an N type floating diffusion layer FD; a reset gate RG being provided with a gate electrode 25 being constructed, by way of an insulation film 24, on a surface of a region neighboring the N type floating diffusion layer FD; and an N type diffusion layer D.

Being different from a pixel shown in FIG. 18, the pixel shown in FIG. 2 comprises an MOS transistor T5 that has a gate thereof connected to a drain of the MOS transistor T1; an MOS transistor T6 that has a drain thereof connected to a source of the MOS transistor T5; and a condenser that has one end thereof connected to a source of the MOS transistor T5; wherein, a connection node between a source of the MOS transistor T5, a drain of the MOS transistor T6 and one end of the condenser C is connected to a gate of the MOS transistor T3.

Moreover, the MOS transistors T1 through T4 are N-channel MOS transistors, wherein a direct current voltage VPS is applied to a cathode of the photodiode PD and to back gates of the MOS transistors T1 through T4, and at the same time, direct current voltages VRS and VPD are applied to drains of the MOS transistors T2 and T3, respectively. In addition, the MOS transistors T5 and T6 are P-channel MOS transistors, wherein, the direct current voltage VPD is applied to back gates of the MOS transistors T5 and T6, a source of the MOS transistor T6 and the other end of the condenser C; and at the same time, the direct current voltage VPS is applied to the drain of the MOS transistor T5. Furthermore, signals φTX, φRS, φV and φRSC are supplied to the gates of the MOS transistors T1, T2, T4 and T6, respectively. Additionally, an output signal line 14 (being equivalent to the output signal lines 14-1 through 14-$m$ shown in FIG. 1) is connected to the source of the MOS transistor T4.

In each pixel constructing a solid state image sensing device in accordance with the present embodiment, the signal φRS being supplied to a reset gate RG is a signal that varies a voltage level among three voltage levels VH, VM and VL (VH>VM>VL). Wherein, by setting the voltage level VM of the signal φRS to be at an appropriate level, it is possible to have the MOS transistor T1 operate in the sub-threshold region when an amount of photo-charges that are generated in the embedded photodiode PD becomes larger than a certain value, whereby photoelectric conversion operation can be switched over between a linear conversion operation and a logarithmic conversion operation in accordance with an amount of incident light.

In addition, in the pixels G11 through Gmn, by having the voltage level VM of the signal φRS change, it is possible to switch over the inflection point at which a photoelectric conversion operation by the embedded photodiode PD and the MOS transistor T1 is switched over from a linear conversion operation to a logarithmic conversion operation. To be more specific, the closer the voltage level VM of the signal φRS is to the voltage level VL, the larger the range of luminance where. a linear conversion operation is performed becomes. Then, when the voltage level VM of the signal φTX is set to be at the voltage level VL, and then the voltage level varies between the two voltage levels VH and VL, only a linear conversion operation is performed. Additionally, the closer the voltage level VM of the signal φRS is to the voltage level VH, the larger the range of luminance in which a logarithmic conversion operation is performed becomes. Then, when the voltage level VM of the signal φRS is set to be at the voltage level VMmax which is closest to the voltage level VH, only a logarithmic conversion operation is performed.

Moreover, the signal φRSC being provided to the gate of the MOS transistor T6 varies among three voltage levels VH, VC and VL (VH>VC>VL). Wherein, by setting the voltage level VC of the signal φRSC to be an appropriate value, the MOS transistor T6 can serve as a constant current source. To be more specific, by having the MOS transistor T6 behave as a constant load being connected to the source of the MOS transistor T5, a source follower circuit can be constructed by the MOS transistors T5 and T6.

Image sensing operations of a solid state image sensing device that is provided with the pixels G11 through Gmn being constructed as described hereinabove will be explained hereinafter. Three kinds of image sensing operations in each pixel, including (1) an image sensing operation only by a linear conversion operation, (2) an image sensing operation only by a logarithmic conversion operation, and (3) an image sensing operation which can switch over between the linear conversion operation and the logarithmic conversion operation, will be described.

[Linear Conversion Operation]

Figure 3:
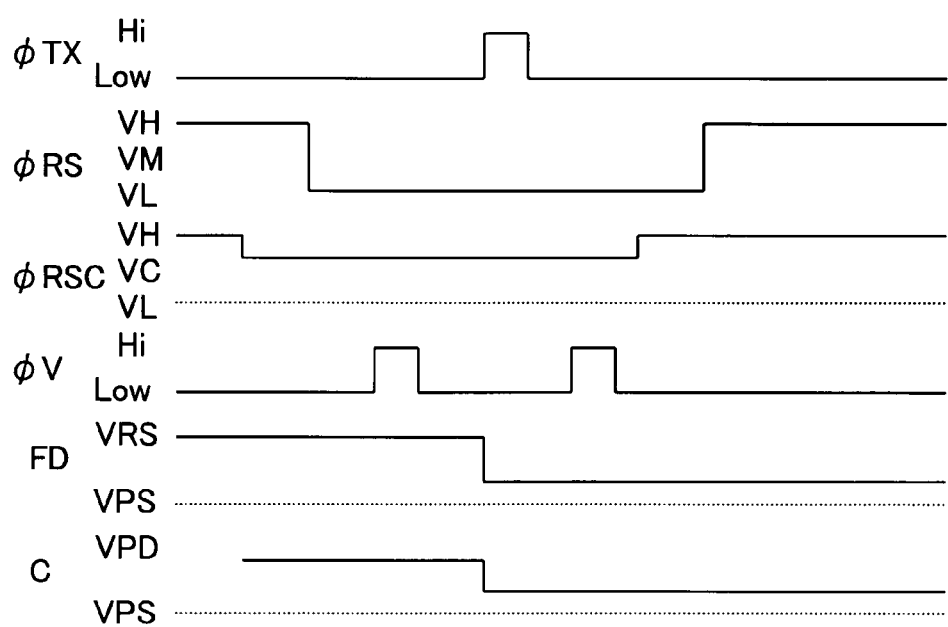
FIG. 3 is a timing chart showing a state of each signal in a pixel shown in FIG. 2 when a linear conversion operation is performed.

By referring to a timing chart shown in FIG. 3, behaviors in each pixel when a linear conversion operation is always performed will be described hereinafter. In addition, FIG. 4A through FIG. 4D show a change of a state of a potential of each channel in the embedded photodiode PD and the MOS transistors T1 and T2.

Figure 4A:
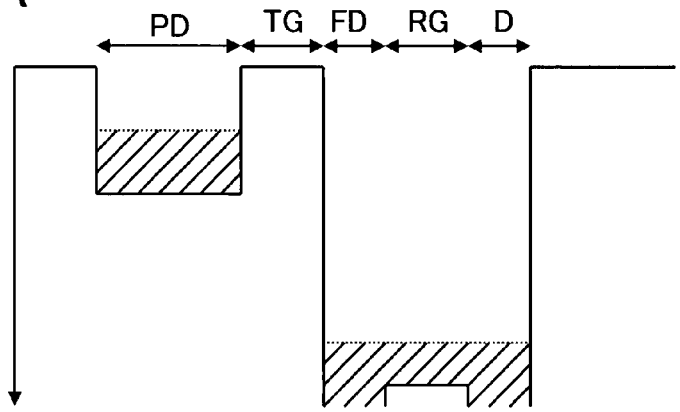
FIG. 4A through FIG. 4D are diagrams showing a state of a potential of each channel in a pixel when an operation is performed in accordance with a timing chart shown in FIG. 3.

First, a signal φTX is set to be at a low blevel, and the voltage level of only the signal φRSC changes to be a voltage level VC from the state in which the voltage level of each of the signals φRS and φRSC is set to be VH. In consequence, the MOS transistor T6 performs, serving as a constant current source, whereby a source follower circuit is constructed by the MOS transistors T5 and T6. Wherein, a state of each potential of the embedded photodiode PD, the transfer gate TG, the reset gate RG and the floating diffusion layer FD is as shown in FIG. 4A.

To be specific, since the voltage level of the signal φRS is set to be VH, the potential of the reset gate RG becomes high, and the MOS transistor T2 is turned ON, whereby the potential of the floating diffusion layer FD is reset. In addition, since the signal φTX is set to be at a low level, the potential of the transfer gate TG becomes low, and the MOS transistor T1 is turned OFF, whereby, photo-charges that are generated by the amount of incident light are stored in the embedded photodiode PD.

Figure 4B:
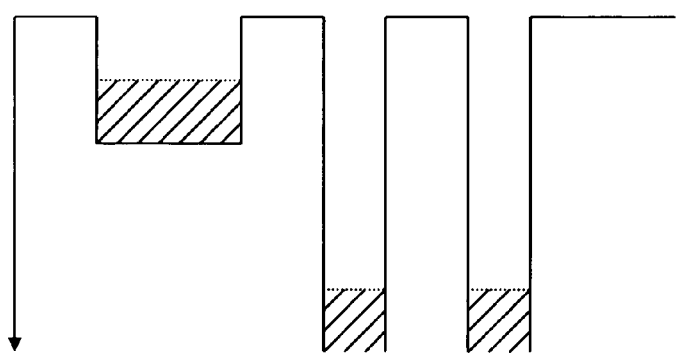

After that, the voltage level of the signal φRS is set to be VL, and as shown in FIG. 4B, the potential of the reset gate RG becomes low, and the MOS transistor T2 is turned OFF. As a result, the gate of the MOS transistor T5 is supplied with a voltage of the floating diffusion layer FD being reset. In consequence, the source voltage of the MOS transistor T5 is sampled and held in the condenser C. Having a state as described hereinabove, a pulse signal φV which is set to be at a high level is supplied, so as to have the MOS transistor T4 turned ON, whereby a source follower circuit is formed by the MOS transistor T3 and the constant current source 16. As a result, a voltage signal corresponding to the voltage level of the floating diffusion layer FD being reset is outputted to the output signal line 14 as a noise signal. Wherein, since the floating diffusion layer FD contains what is called a kTC noise, a noise signal also contains a voltage constituent due to the kTC noise.

Figure 4C:
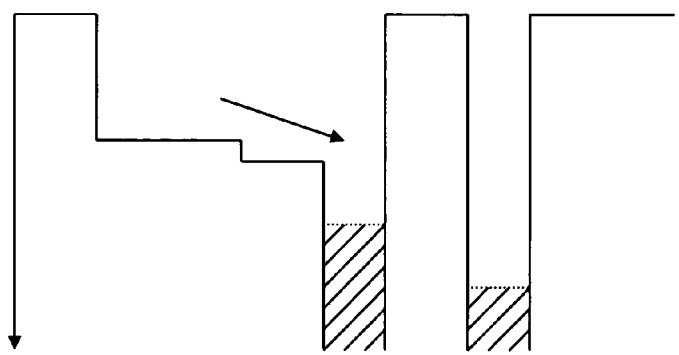

After a noise signal is produced, and the signal φV is set to be at a low level, thereby having the MOS transistor T4 turned OFF, the signal φTX will be set at a high level so as to make the potential of the transfer gate TG become high as shown in FIG. 4C, and thereby, the MOS transistor T1 is turned ON. As a result, photo-charges being stored in the embedded photodiode PD are transferred to the floating diffusion layer FD, thereby lowering the potential of the floating diffusion layer FD. To be specific, the drain voltage of the MOS transistor T1 changes to be a voltage level corresponding to the amount of incident light. In consequence, a voltage corresponding to the integration value of the amount of incident light appears to the gate of the MOS transistor T5, and a source voltage of the MOS transistor T5 serving as a voltage corresponding to the amount of the integration value of the amount of incident light is sampled and held in the condenser C.

Figure 4D:
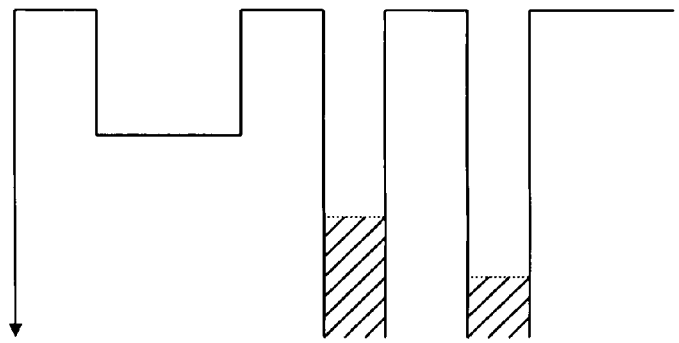

Then, when the signal φTX is set to be at a low level so as to lower the potential of the transfer gate TG as shown in FIG. 4D, whereby the MOS transistor T1 is turned OFF, the photo-charges being transferred to the floating diffusion layer FD are stored. When a pulse signal φV which is set to be at a high level is supplied and the MOS transistor T4 is turned ON, with the state as has described above, a source follower circuit is formed by the MOS transistor T3 and the constant current source 16. As a result, a voltage signal corresponding to the voltage level of the floating diffusion layer FD to which the amount of photo-charges serving as the integration value of the amount of incident light is transferred is produced to the output signal line 14 as an image signal. To be specific, an image signal is produced, serving as a voltage signal which is changed linearly for the integration value of the amount of incident light.

Subsequently, after the signal φV is set to be at a low level and the MOS transistor T4 is turned OFF, first, the voltage level of the signal φRSC is set to be VH, whereby the MOS transistor T6 is turned OFF. Then, by setting the voltage level of the signal φRS to be VH, so as to have the MOS transistor T2 turned ON, the potential of the floating diffusion layer FD is reset. In addition, when the signal φTX is set to be at a low level, photo-charges will be stored in the embedded photodiode PD, and an image sensing operation will start in the next frame. Moreover, a same signal can be obtained by setting the voltage level of the signal φRSC to be always VC, but in this case, electric power consumption will be large because electric currents always flow to a source follower circuit being constructed by the MOS transistors T5 and T6.

[Logarithmic Conversion Operation]

By referring to a timing chart shown in FIG. 5, behaviors in each pixel when a logarithmic conversion operation is always performed will be described hereinafter. In addition, FIG. 6 shows a change of a state of a potential of each channel in the embedded photodiode PD and the MOS transistors T1 and T2.

In this operation, the signal φTX is always set to be at a high level, and the voltage level of the signal φRS is always set to be VMmax. As a result, as shown in FIG. 6, the potential of the transfer gate TG is always placed in a high condition, whereby the MOS transistor T1 is turned ON; the photo-charges that are generated in the embedded photodiode PD are always ready to be transferred to the floating diffusion layer FD; and the MOS transistor T2 is operated in the sub-threshold region. In consequence, a photoelectric current Ip corresponding to a behavior of the MOS transistor T2 in the sub-threshold region flows to the MOS transistors T1 and T2.

The photoelectric current Ip flowing through the MOS transistors T1 and T2 is expressed as an equation (1) below, where "Id" is a drain current; "Vfd" is a voltage level of the floating diffusion layer FD; "Id2" and "n" are constants that are determined by the shape and the substrate density of the MOS transistor T2; "q" is an amount of electronic charge; "k" is a Boltzmann constant; and "T" is an absolute temperature.

$$Ip = Id2 \times \text{expe}(q/nkT \times Vfd) \quad (1)$$

In such a condition as described hereinabove, by setting the voltage level of the signal φRSC to be VH, thereby having the MOS transistor T6 turned OFF, the MOS transistor T5 performs in the sub-threshold region. As a result, an electric current I5 flowing through the MOS transistor T5 is expressed as an equation (2) below, where "Id5" is a constant that is determined by the shape and the substrate density of the MOS transistor T5; and "Vcn" is a voltage that appears to a connection node between the condenser C and the soruce of the MOS transistor T5.

$$I5 = Id5 \times \exp(q/nkT \times (Vcn - Vfd)) \quad (2)$$

To be specific, when "a" is equal to "Id5/Id2" (a=Id5/Id2), based on the above-mentioned equations (1) and (2), an electric current I5 flowing through the MOS transistor T5 is expressed as an equation (3) below. In consequence, since by the MOS transistor T6 being turned OFF, an electric current flowing through the condenser C is equal to the electric current I5 flowing through the MOS transistor T5, an equation (4) below can be expressed, where a capacitance value of the condenser C is "C." Based on the equations (3) and (4), the relationship shown in an equation (5) below can be obtained.

$$I5 = a \times Ip \times \exp(q/nkT \times Vcn) \quad (3)$$

$$I5 = C \times dVcn/dt \quad (4)$$

$$C \times dVcn = a \times Ip \times \exp(q/nkT \times Vcn) \times dt \quad (5)$$

In consequence, when the above equation (5) is integrated with having the value of a voltage Vcn at the time "t" of zero (0) set to be a voltage level VPD, a relationship as shown in an equation (6) below can be obtained. To be specific, based on a proportional relationship in a logarithmic manner to an integration value of the time of photoelectric currents Ip flowing through the MOS transistors T1 and T2, a voltage level Vcn of the condenser C is decreased.

$$Vcn = VPD - nkt/q \times In[a \times q/nkTC \times \int Ip \cdot dt] \quad (6)$$

By having a voltage Vfd of the floating diffusion layer FD change in a natural logarithmic manner for the amount of incident light as described hereinabove, based on the integrating behavior performed by the condenser C, a voltage Vcn which appears to the gate of the MOS transistor T3 becomes proportional in a natural logarithmic manner to the integration value of the amount of incident light. At this time, when a pulse signal φV being at a high level is supplied to the gate of the MOS transistor T4, thereby having the MOS transistor T4 truned ON, a voltage signal which is proportional in a natural logarithmic manner to the integration value of the amount of incident light falling on the embedded photodiode PD is outputted to the output signal line 14 as an image signal.

After an image signal is outputted, and a signal φV is set to be at a low level, thereby having the MOS transistor T4 turned OFF, the voltage level of the signal φRSC is set to be VL, whereby the MOS transistor T6 is turned ON. As a result, the voltage level of the connection node between the condenser C and the gate of the transistor T3 is reset at the direct current voltage VPD by way of the MOS transistor T6. When this resetting behavior is completed, the voltage level of the signal φRSC is set to be VH, whereby the MOS transistor T6 is turned OFF again.

After that, by being provided with a pulse signal φV which is at a high level, the MOS transistor T4 is turned ON, and thereby, a voltage signal corresponding to a gate voltage of the MOS transistor T3 appearing in a state that the condenser C is resetted is outputted to the output signal line 14 as a noise signal. Then, after a noise signal is outputted, the signal φV is set to be at a low level, and thereby, the MOS transistor T4 is turned OFF. In addition, when the voltage level of the signal φRSC is set to be VH, thereby having the MOS transistor T6 turned OFF, integrating behavior starts in the condenser C, which starts an image sensing operation in the next frame.

[Automatic Switching-Over Between the Linear Conversion Operation and the Logarithmic Conversion Operation (Automatic Switching-Over Operation]

By referring to a timing chart shown in FIG. 7, behaviors that are performed in each pixel when an automatic switching-over operation that can switch over between the linear conversion operation and the logarithmic conversion operation is performed will be described hereinafter. In addition, FIG. 8A through FIG. 8C show a change of a state of a potential of each channel of the embedded photodiode PD and the MOS transistors T1 and T2.

In the above-mentioned behaviors, the signal φTX is always set to be at a high level in the same manner as the logarithmic conversion operation is always performed. In consequence, as shown in FIG. 8A, the potential of the transfer gate TG is always set to be at a high level, whereby the MOS transistor T1 is turned ON. In addition, at the time of an image sensing, the voltage level of the signal φRS is set to be VM, and the voltage level of the signal φRSC is set to be VH, whereby the MOS transistor T6 if turned OFF. Moreover, by adjusting the value of the voltage level VM, the inflection point between the linear conversion operation and the logarithmic conversion operation is adjusted.

Figure 8A:
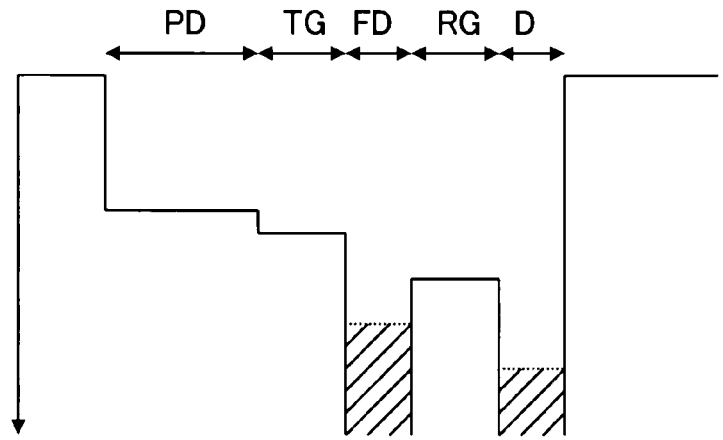
FIG. 8A through FIG. 8C are diagrams showing a state of a potential of each channel in a pixel when an operation is performed in accordance with a timing chart shown in FIG. 7.

To be specific, photo-charges that are generated in the embedded photodiode PD are transferred to the floating diffusion layer FD by way of the transfer gate TG, but when the luminance of a subject of image sensing is low, the photo-charges that are generated in the embedded photodiode PD are stored in the floating diffusion layer FD as shown in FIG. 8A. Then, the gate voltage of the MOS transistor T5 becomes a value based on the photo-charges that are stored in the floating diffusion layer FD, which is namely a value being proportional in a linear manner to the integration value of the amount of incident light. In addition, when the luminance of a subject is high, an amount of the photo-charges that are stored in the floating diffusion layer FD becomes large, so that as shown in FIG. 8B, the voltage of the floating diffusion layer FD comes close to the voltage level VM that is supplied to the reset gate RG, whereby the MOS transistor T2 works in the sub-threshold region.

As a result, when the luminance of a subject is low, electric currents that change linearly for the amount of incident light flow to the MOS transistor T5, and a voltage that changes linearly for the integration value of the amount of incident light appears to the condenser C. In addition, when the luminance of a subject is high, electric currents that change in a natural logarithmic manner for the amount of incident light flow to the MOS transistor T5, and a voltage that changes in a natural logarithmic manner for the integration value of the amount of incident light appears to the condenser C. At this time, such an image signal is outputted to the output signal line 14 as comes to be a value that is changed linearly for the luminance amount in a low luminance range as well as a value that is changed in a logarithmic manner for the luminance amount in a high luminance range, by having a pulse signal φV being at a high level is supplied to the gate of the MOS transistor T4, thereby having the MOS transistor T4 turned ON.

Subsequently, after an image signal is outputted, and the signal φV is set to be at a low level, thereby having the MOS transistor T4 turned OFF, first, the voltage level of the signal φRS is set to be VH, and as shown in FIG. 8C, the potential of the reset gate RG becomes high. To be specific, by having the MOS transistor T2 turned ON, the potential of the floating diffusion layer FD is reset. Then, the voltage level of the signal φRSC is set to be VL, thereby having the MOS transistor T6 turned ON, the voltage of the condenser C is reset. When the resetting behavior of the condenser C is completed, the voltage level of the signal φRSC is set to be VH, and thereby, the MOS transistor T6 is turned OFF again.

At this time, by providing a signal φV being at a high level, thereby having the transistor T4 turned ON, a noise signal is outputted to the output signal line 14. Then, after a noise signal is outputted, the signal φV comes to be at a low level, thereby having the MOS transistor T4 turned OFF. And then the voltage level of the signal φRS is set to be VM, and thereby, an image sensing operation starts in the next frame.

In the above-mentioned behaviors, when a noise signal and an image signal are outputted to the output signal lines 14-1 thorough 14-*m*, the noise signal and the image signal are sampled and held in the sample-hold circuits 17-1 through 17-*m*. After that, the image signal and the noise signal that are sampled and held are outputted to the correction circuit 18 from the sample-hold circuits 17-1 through 17-*m* sequentially, and then, the image signal and the noise signal are subject to subtraction process in the correction circuit 18, whereby an image signal with a noise eliminated is outputted.

In addition, in the logarithmic conversion operation and the automatic switching-over operation, a noise signal does not contain a voltage constituent due to a kTC noise caused by the floating diffusion layer FD, but contains an offset due to a threshold voltage of the MOS transistor T3, so that the offset can be eliminated. In addition, in the linear conversion operation, because the noise signal contains a voltage constituent due to a kTC noise caused by the floating diffusion layer FD, effects of the kTC noise can also be eliminated.

Moreover, in a solid state image sensing device performing as mentioned hereinabove, a linear conversion operation is switched over to a logarithmic conversion operation or an automatic switching-over operation for each frame. Or, a logarithmic conversion operation or an automatic switching-over operation can be switched over to a linear conversion operation. To be specific, for example, by switching over between the linear conversion operation and the logarithmic conversion operation for each frame, it is possible to select from image signals for two frames an image signal of a frame being obtained by the linear conversion operation in a low luminance range and an image signal of a frame being obtained by the logarithmic conversion operation in a high luminance range. Then, by combining the image signals that are selected from two frames, an image signal having an optimum value is outputted in the high luminance range and the low luminance range, respectively.

Behaviors in switching over the conversion operations will be described hereinafter.

[Switching Over from a Linear Conversion Operation to a Logarithmic Conversion Operation]

Figure 9:
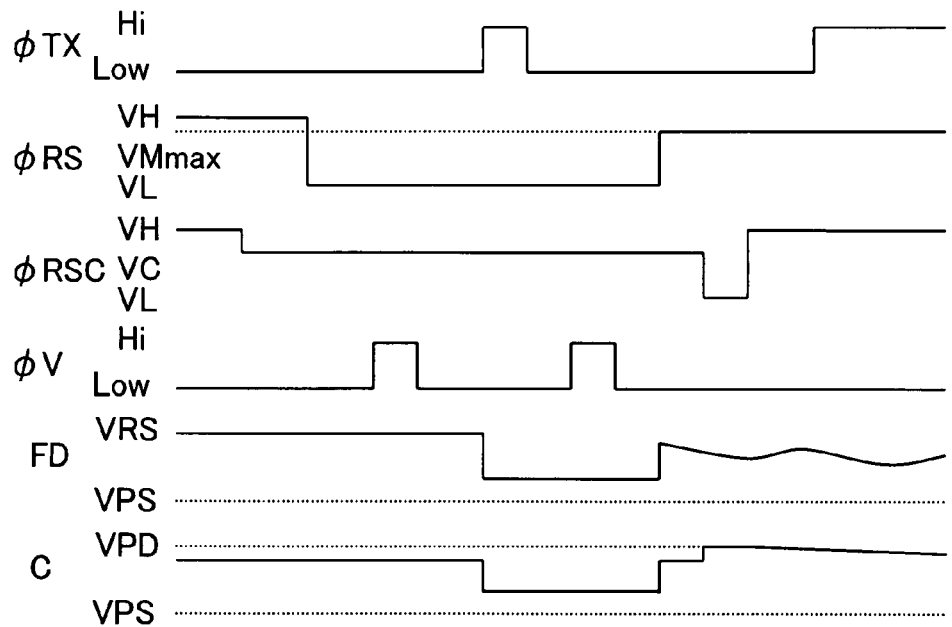
FIG. 9 is a timing chart showing a state of each signal in a pixel shown in FIG. 2 when a linear conversion operation is switched over to a logarithmic conversion operation.

First of all, behaviors in switching over from a linear conversion operation to a logarithmic conversion. operation will be described based on a timing chart shown in FIG. 9. As described hereinabove, in accordance with the timing chart shown in FIG. 3, an image signal being obtained by a linear conversion operation after a noise signal is outputted is produced, and an image sensing operation is performed for one frame. After that, the voltage level of the signal φRS is changed over from VL to VMmax, which sets the MOS transistor T2 to work in the sub-threshold region. Then, by setting the voltage level of the signal φRSC to be VL, thereby having the MOS transistor T6 turned ON, the voltage level of the condenser C is reset by way of the MOS transistor T6.

Subsequently, after setting the signal φRSC to be VH, thereby having the MOS transistor T6 turned OFF, the signal φTX is set to be at a high level. As a result, by making the potential of the transfer gate TG high, thereby having the MOS transistor T1 turned ON, photo-charges that are generated in the embedded photodiode PD are transferred to the floating diffusion layer FD. After the value of each signal is changed in a manner as described hereinabove, in the next frame, a logarithmic conversion operation is performed in accordance with the timing chart shown in FIG. 5 in such a manner as has been described.

[Switching-Over from a Linear Conversion Operation to an Automatic Switching-Over Operation]

Figure 10:
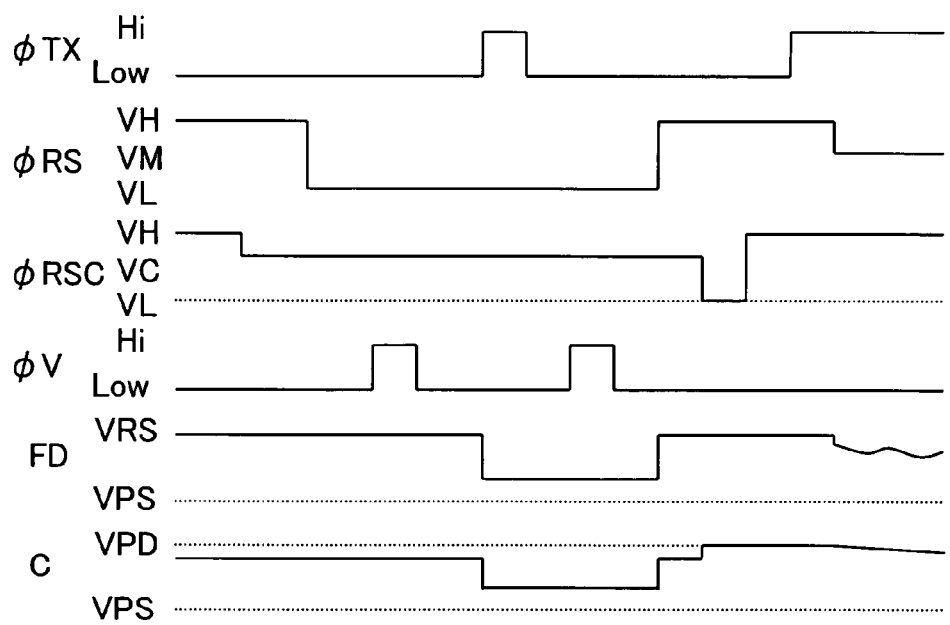
FIG. 10 is a timing chart showing a state of each signal in a pixel shown in FIG. 2 when a linear conversion operation is switched over to an automatic conversion operation.

In addition, behaviors in switching over from a linear conversion operation to an automatic switching-over operation will be described based on a timing chart shown in FIG. 10. In this case, when an image sensing operation for one frame by a linear conversion operation is completely performed in accordance with the timing chart shown in FIG. 3, the voltage level of the signal φRS is set to be VH, thereby having the MOS transistor T2 turned ON. As a result, the potential of the floating diffusion layer FD is reset by way of the MOS transistor T2.

Subsequently, after setting the voltage level of the signal φRSC to be VL, thereby having the MOS transistor T6 turned ON and resetting the voltage level of the condenser C by way of the MOS transistor T6, the voltage level of the signal φRSC is set to be VH, whereby the MOS transistor T6 is turned OFF. Then, by setting the signal φTG to be at a high level and making the potential of the transfer gate TG high, photo-charges are put into such condition as can be transferred from the embedded photodiode PD to the floating diffusion layer FD, and after that, the voltage level of the signal φRS is changed over to be VM. As a result, an automatic switching-over operation is performed in accordance with the timing chart shown in FIG. 7 in the next frame.

[Switching-Over from a Logarithmic Conversion Operation to a Linear Conversion Operation]

Figure 11:
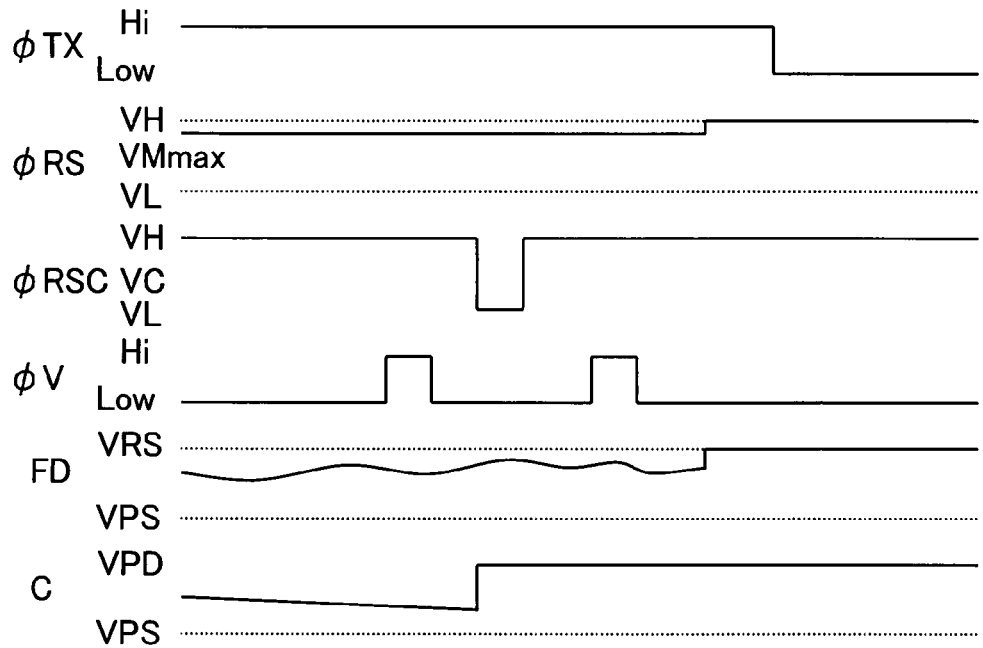
FIG. 11 is a timing chart showing a state of each signal in a pixel shown in FIG. 2 when a logarithmic conversion operation is switched over to a linear conversion operation.

Additionally, behaviors in switching over from a logarithmic conversion operation to a linear conversion operation will be described based on a timing chart shown in FIG. 11. In this case, after an image signal being obtained by a logarithmic conversion operation based on the timing chart shown in FIG. 5 is produced, a noise signal being obtained by resetting is outputted. As a result, an image sensing operation for one frame is completed. And then, after the signal φV is set to be at a low level, thereby having the MOS transistor T4 turned OFF, first the voltage level of the signal φRS is changed from Vmax to VH, which makes the potential of the reset gate RG high, whereby the MOS transistor T2 is turned ON.

Subsequently, the signal φTX is set to be at a low level, and the potential of the transfer gate TG is lowered, thereby having the MOS transistor T1 turned OFF, and consequently, photo-charges are prohibited from being transferred from the embedded photodiode PD to the floating diffusion layer FD. As a result, photo-charge corresponding to the amount of incident light are stored in the embedded photodiode PD, and an image sensing operation by the linear conversion operation starts in the next frame. Since the voltage level of the signal φRS is already set to be VH, whereby the MOS transistor T2 is turned ON at this time, the potential of the floating diffusion layer FD is reset by the voltage level VPD.

[Switching-Over from an Automatic Switching-Over Operation to a Linear Conversion Operation]

Figure 12:
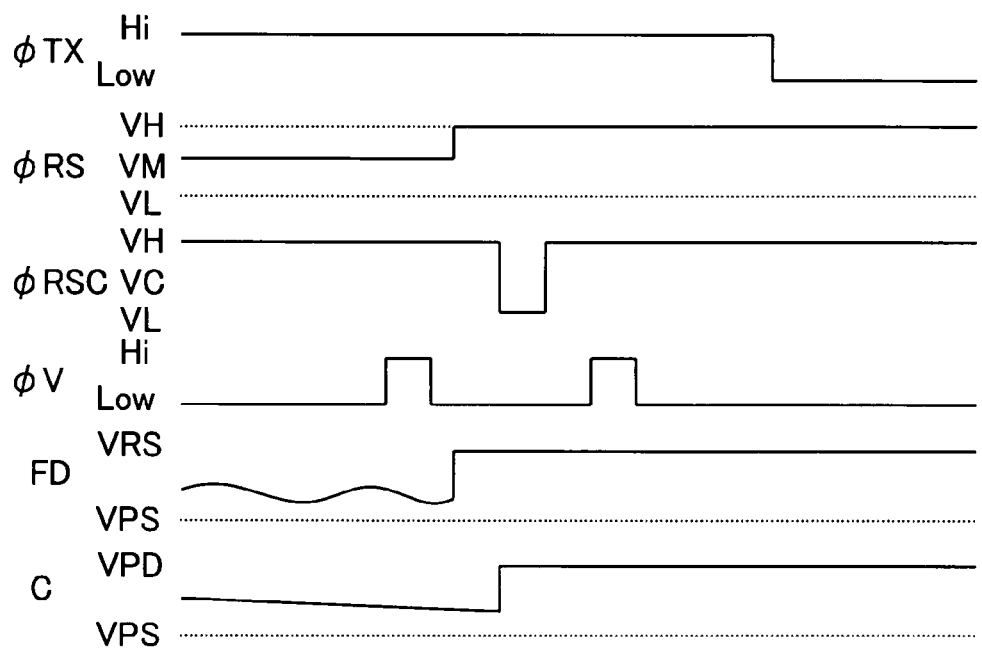
FIG. 12 is a timing chart showing a state of each signal in a pixel shown in FIG. 2 when an automatic conversion operation is switched over to a linear conversion operation.

Moreover, behaviors in switching over from an automatic switching-over operation to a linear conversion operation will be described based on a timing chart shown in FIG. 12. In this case, after an image signal being obtained by an automatic switching-over operation in accordance with the timing chart shown in FIG. 7 is produced, a noise signal being obtained by resetting performance is outputted, whereby an image sensing operation is performed for one frame. Then, after the signal φV is set to be at a low level, thereby having the MOS transistor T4 turned OFF, the voltage level of the signal φRS remains as VH, thereby having the MOS transistor T2 remain ON. After that, the signal φTX is set to be at a low level, thereby having the MOS transistor T2 remain ON. Subsequently, the signal φTX is set to be low, thereby having the MOS transistor T1 turned OFF, which prohibits photo-charges from being transferred from the embedded photodiode PD to the floating diffusion layer FD, whereby an image sensing operation by a linear conversion operation starts in the next frame.

A conversion operation can be changed for each frame as described hereinabove. In addition, switching-over of the conversion operation in each frame may be performed for each frame in such a manner as the above-mentioned embodiment. However, among "x" frames having a predetermined time, "y" frame may have a linear conversion operation performed therein, and "(x-y)" frames may have a logarithmic conversion operation or an automatic switching-over operation performed therein. Then, in combining the "x" frames that are obtained, frames for reproduction may be produced by judging the luminance range of a subject whose image is sensed in a position of each pixel. In addition, among "x" frames, frames for reproduction may be produced by combining with "z" frames, and in "(x-z)" frames, frames for sensing to judge the luminance range in a position of each pixel may be produced.

[First Modified Embodiment of the Logarithmic Conversion Operation and the Automatic Switching-Over Operation]

Figure 5:
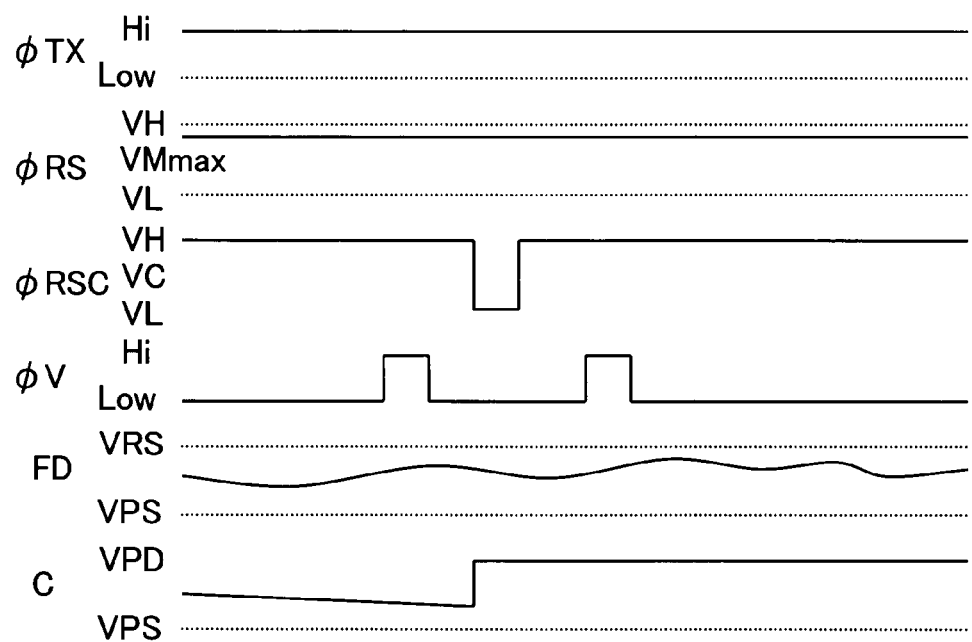
FIG. 5 is a timing chart showing a state of each signal in a pixel shown in FIG. 2 when a logarithmic conversion operation is performed.
Figure 6:
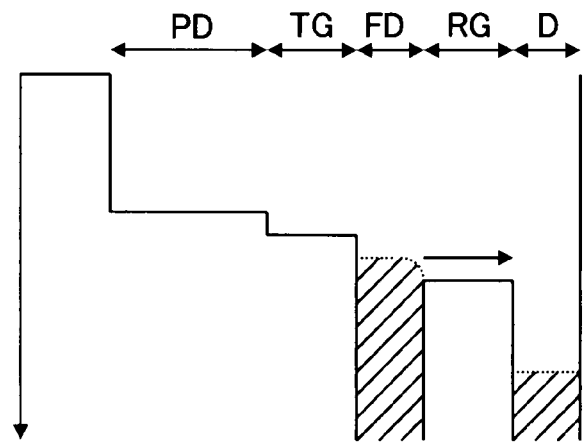
FIG. 6 is a diagram showing a state of a potential of each channel in a pixel when an operation is performed in accordance with a timing chart shown in FIG. 5.
Figure 7:
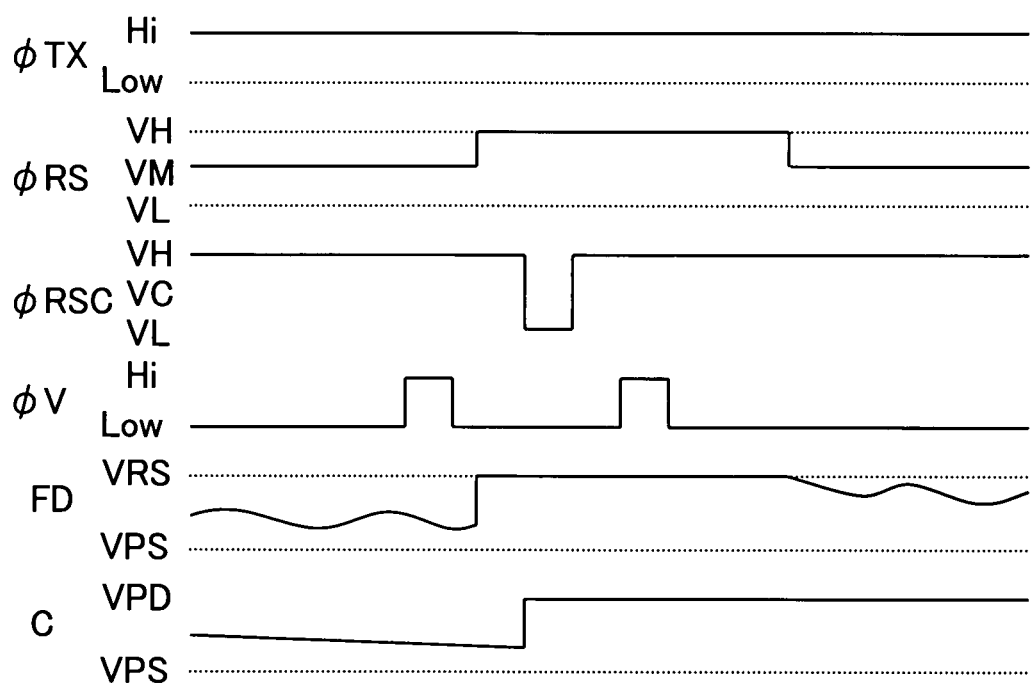
FIG. 7 is a timing chart showing a state of each signal in a pixel shown in FIG. 2 when an auto conversion operation is performed.
Figure 8B:
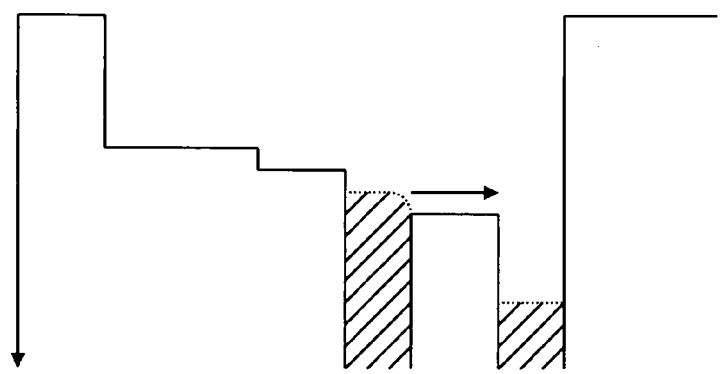
Figure 8C:
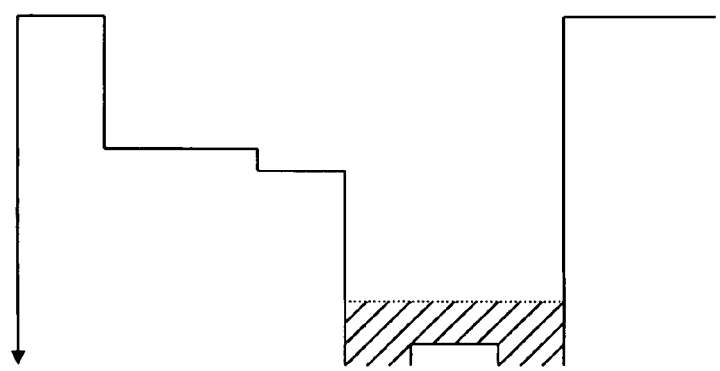
Figure 13:
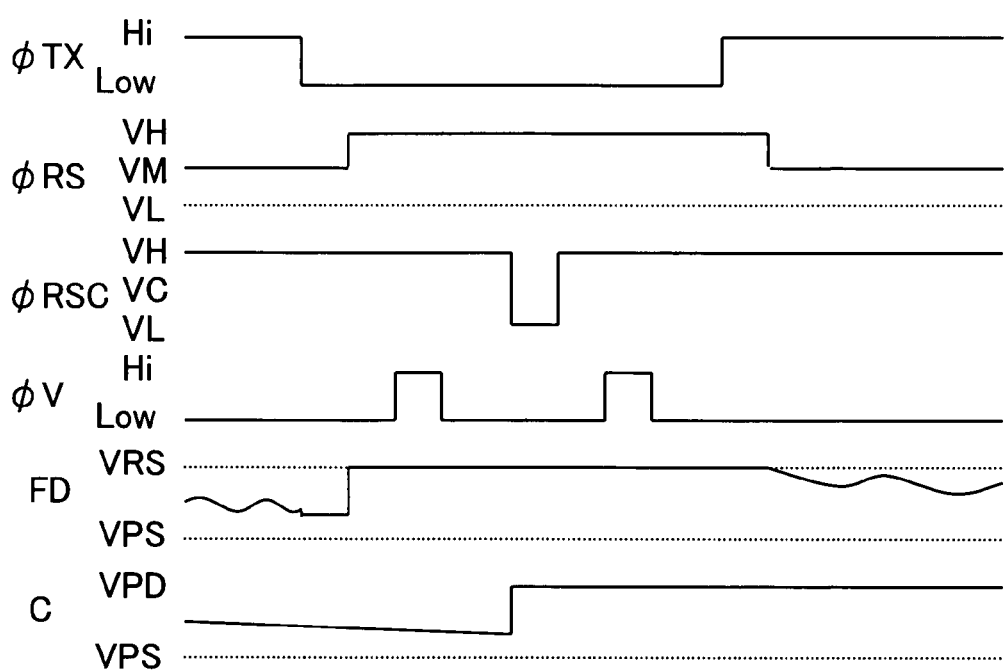
FIG. 13 is a timing chart showing a state of each signal in a pixel shown in FIG. 2 when an automatic conversion operation is performed.

In addition, the logarithmic conversion operation and the automatic switching-over operation are not be limited to the logarithmic conversion operation in accordance with the timing chart shown in FIG. 5 and to the automatic switching-over operation in accordance with the timing chart shown in FIG. 7, but may be performed in accordance with another timing. In addition, in accordance with the present embodiment, either of the logarithmic conversion operation and the automatic switching-over operation has a same timing. Therefore, the timing of each signal by the automatic switching-over operation will be described in accordance with a timing chart shown in FIG. 13.

Figure 14A:
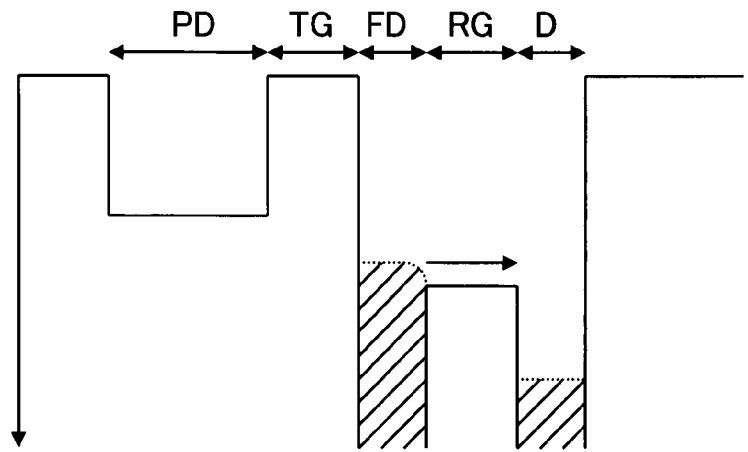
FIG. 14A through FIG. 14C are diagrams showing a state of a potential of each channel in a pixel when an operation is performed in accordance with a timing chart shown in FIG. 13.

In accordance with the present embodiment, being different from the behaviors in accordance with the timing chart shown in FIG. 7, the signal φTX is set to be at a low level when an image signal and a noise signal are read out. In addition, the timing to switch over the voltage level of the signal φRS from VM to VH comes before reading out of an image signal, by providing a pulse signal φV which is set to be at a high level. To be specific, at first, the signal φTX is set at a low level, and the potential of the transfer gate TG is lowered as shown in FIG. 14A, whereby the MOS transistor T1 is turned OFF. As a result, photo-charges that are generated in the embedded photodiode PD are prevented from being transferred to the floating diffusion layer FD.

Figure 14B:
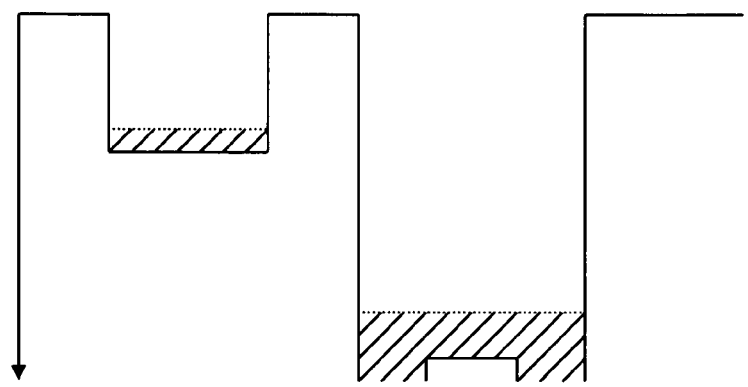

Then, the voltage level of the signal φRS is changed from VM to VH, and the potential of the reset gate RG is made high as shown in FIG. 14B, whereby the MOS transistor T2 turned ON. As a result, the potential of the floating diffusion layer FD is increased to be high by the direct current voltage VRS, whereby the MOS transistor T5 is turned OFF. In consequence, the voltage level being obtained by being integrated in the condenser C at the time of image sensing is sampled and held in the condenser C. At this time, by providing a pulse signal φV being at a high level, the MOS transistor T4 is turned ON, whereby an image signal is outputted to the output signal line 14.

Figure 14C:
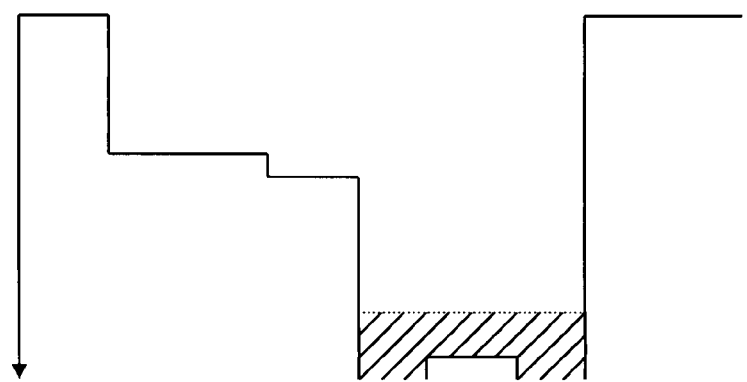

After outputting an image signal in such a manner as described hereinabove, by setting the voltage level of the signal φRSC to be VL temporarily, thereby having the MOS transistor T6 turned ON, the condenser C is reset, and subsequently, after the voltage level of the signal φRSC is returned to be VH, a pulse signal φV being at a high level is provided. In consequence, after the MOS transistor T4 is turned ON, and a noise signal is produced, by setting the signal φTX to be at a high level, thereby making the potential of the transfer gate TG high, charges that are stored in the embedded photodiode PD as long as the signal φTX is at a low level are discharged, as shown in FIG. 14C. After that, by changing over the voltage level of the signal φRS from VH to VM, an image sensing operation starts in the next frame.

Figure 15:
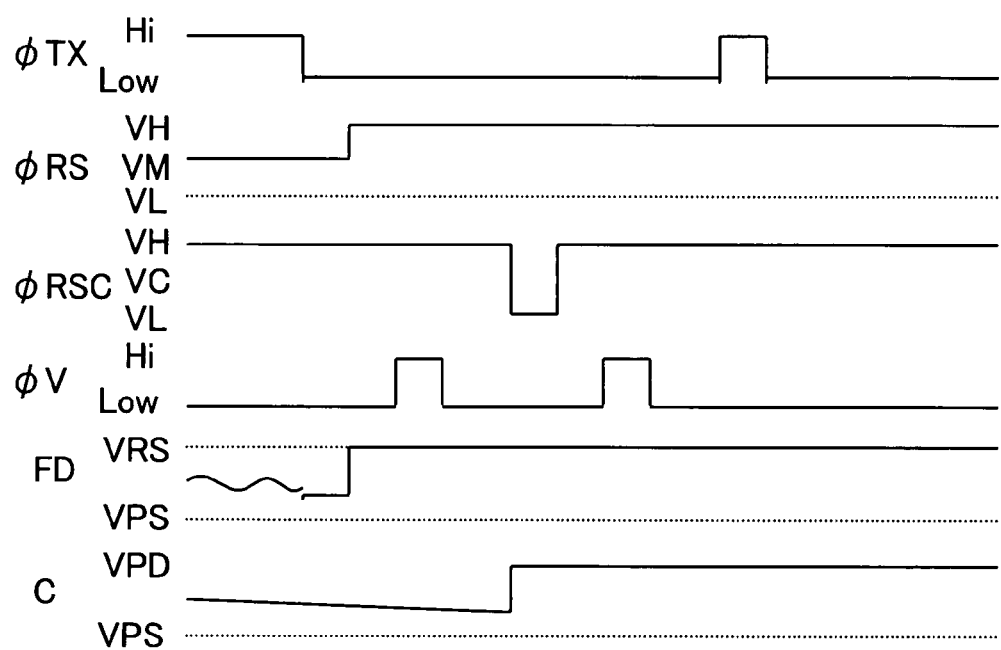
FIG. 15 is a timing chart showing a state of each signal in a pixel shown in FIG. 2 when an automatic conversion operation is switched over to a linear conversion operation.

In addition, when the logarithmic conversion operation and the automatic switching-over operation are switched over to the linear conversion operation, as shown in FIG. 15, by setting the signal φTX to be at a high level temporarily after producing a noise signal, charges that are stored in the embedded photodiode PD are discharged. After that, by having the voltage level of the signal φRS remain as VH and setting the signal φTX to be at a low level, thereby making the potential of the transfer gate TG low, an image sensing operation by the linear conversion operation starts in the next frame.

[Second Modified Embodiment of the Logarithmic Conversion Operation and the Automatic Switching-Over Operation]

Figure 16:
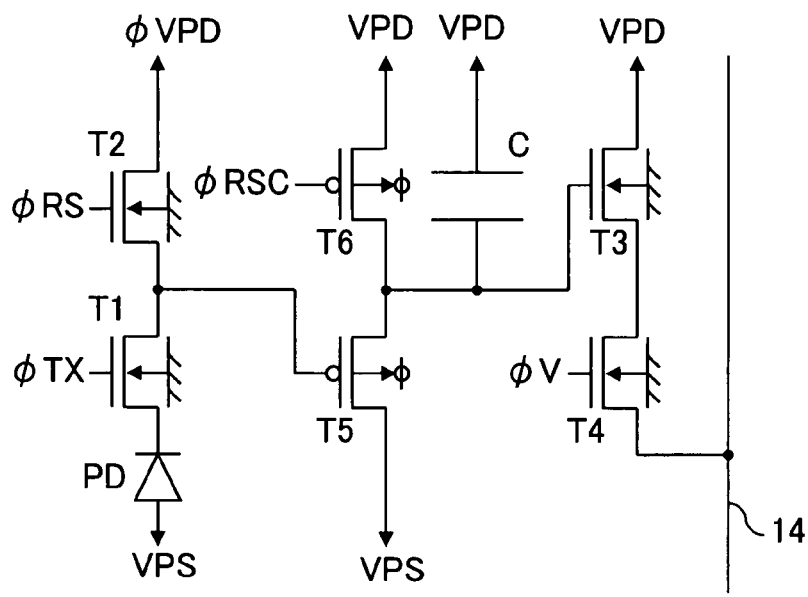
FIG. 16 is a circuit diagram showing another configuration of a pixel which is provided to a solid state image sensing device shwon in FIG. 1.
Figure 17:
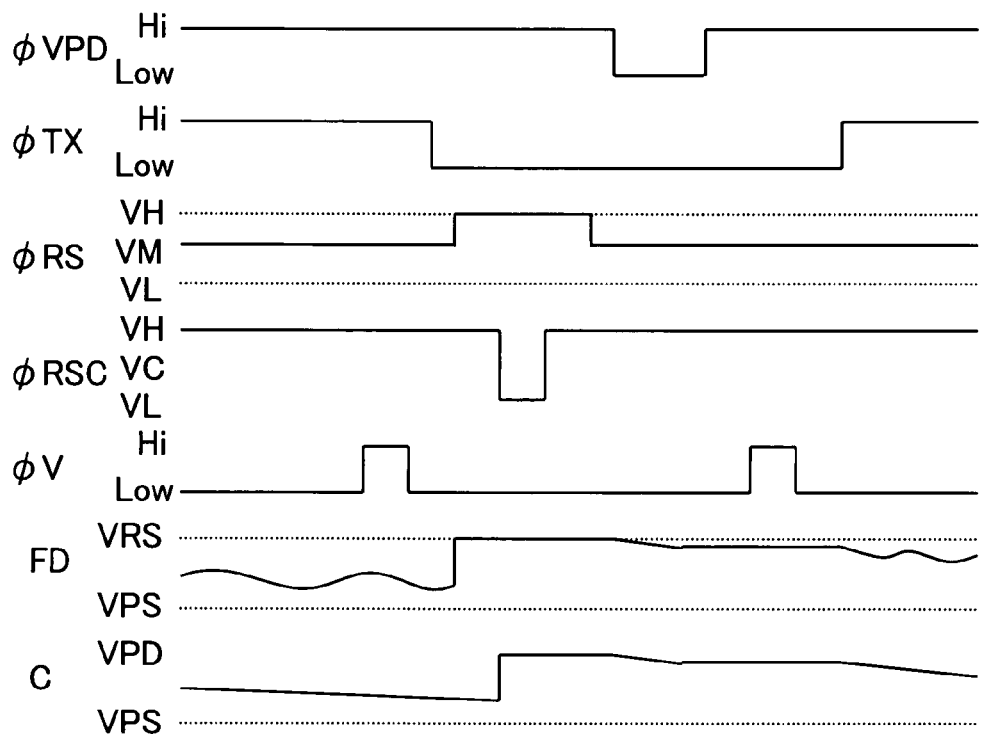
FIG. 17 is a timing chart showing a state of each signal in a pixel shown in FIG. 16 when an automatic conversion operation is performed.

In addition to the above-mentioned first modified embodiment of the logarithmic conversion operation and the automatic switching-over operation, such operation can be performed as has a variation of the threshold of the MOS transistor T2 included in a noise signal. An embodiment of the operation of the logarithmic conversion operation and the automatic switching-over operation at this time will be descried in accordance with a timing chart shown in FIG. 17, taking an automatic switching-over operation as a representative. In addition, in accordance with the present embodiment, as shown in a configuration of a pixel shown in FIG. 16, instead of having the direct current voltage VPD applied to the drain of the MOS transistor T2, the signal φVPD that changes between two levels, a high level and a low level, is supplied. Moreover, the voltage level of the signal φVPD being at a high level is equivalent to the value of the direct current voltage VRS.

In accordance with the present embodiment, same as the behaviors in accordance with the timing chart shown in FIG. 7, with the signal φVPD being at a high level, a direct current voltage VRS is applied to the drain of the MOS transistor T2, when an image sensing operation is performed. Then, at first, after a signal φV is provided so as to have the MOS transistor T4 turned ON, thereby producing an image signal, the signal φTX is set to be at a low level, which makes the potential of the transfer gate TG low, whereby the MOS transistor T1 is turned OFF. As a result, photo-charges that are generated in the embedded photodiode PD are prohibited from being transferred to the floating diffusion layer FD.

After that, by changing the voltage level of the signal φRS from VM to VH, the potential of the reset gate RF is made high, and thereby, the MOS transistor T2 is turned ON. As a result, the potential of the floating diffusion layer FD is reset to be the direct current voltage VRS, whereby the MOS transistor T5 is turned OFF, so as to be blocked off. At this time, after resetting the condenser C by setting the voltage level of the signal φRSC to be VL temporarily, so as to have the MOS transistor T6 turned ON, the voltage level of the signal φRSC is returned to VH.

Subsequently, after the voltage level of the signal φRS is set to be VM, the signal φVPD is changed from a high level to a low level, and thereby, the direct current voltage being supplied to the drain of the MOS transistor T2 is lowered. As a result, the voltage of the floating diffusion layer FD is decreased in accordance with the threshold of the MOS transistor T2. To be specific, the variation of the threshold of the MOS transistor T2 that performs a sub-threshold performance is reflected to the voltage of the floating diffusion layer FD. Then, after the voltage level of the floating diffusion layer FD becomes steady, the signal φVPD is changed from a low level to a high level, so as to apply the direct current voltage VRS to the drain of the MOS transistor T2.

At this time, the MOS transistor T5 which has a gate thereof connected to the floating diffusion layer FD can flow a large amount of electric currents until the voltage difference between the voltage level of the floating diffusion layer FD and the voltage level of the connection node to the condenser C exceeds the threshold voltage of the MOS transistor T5. In consequence, a voltage appearing to the connection node between the condenser C and the drain of the MOS transistor T5 decreases in accordance with the variation of the threshold voltage of the MOS transistor T5.

As a result, the voltage level of the voltage that is sampled and held in the connection node between the condenser C and the drain of the MOS transistor T5 comes to correspond to the threshold voltages of the MOS transistors T2 and T5. Consequently, after the signal φVPD is changed from a low level to a high level, a pulse signal φV being at a high level is supplied, so as to have the MOS transistor T4 turned ON, and thereby, a noise signal including a constituent for the variation of the threshold voltages of the MOS transistors T2 and T5 is produced. Then, in consequence, an image signal which eliminates the variation of the threshold voltages of the MOS transistors T2 and T5 of each pixel including the kTC noises can be outputted from the correction circuit 18.

Moreover, in accordance with the present embodiment, same as the first modified embodiment, a pulse signal φV being at a high level may be supplied after the signal φTX is set to be at a low level and the voltage level of the signal φRS is set to be VH. To be specific, an image signal may be produced after at first, photo-charges are prohibited from being transferred from the embedded photodiode PD to the floating diffusion layer FD, and the MOS transistor T5 is turned OFF, thereby sampling and holding the voltage level, which is obtained after image sensing performed, in the condenser C.

What is claimed is:

1. A solid state image sensing device comprising:
   a plurality of pixels comprising:
   a photoelectric conversion element that generates a photo-charge in accordance with an amount of an incident light and stores a generated photo-charge therein;
   a charge-holding portion that has the generated photo-charge transferred from the photoelectric conversion element so as to hold the generated photo-charge temporarily;
   a transfer gate that is formed between the photoelectric conversion element and the charge-holding portion;
   a first transistor that has a first electrode thereof connected to the charge-holding portion, has a second electrode thereof applied with a direct current voltage, and has a control electrode thereof provided with a first control signal that can change over among three voltage levels;
   a second transistor that is provided with a first electrode, a second electrode and a control electrode and has a control electrode thereof connected to the charge-holding portion;
   a third transistor that has a second electrode thereof connected to the first electrode of the second transistor, has a first electrode thereof applied with a second direct current voltage, and has a control electrode thereof provided with a second control signal that can change over among three voltage levels;
   a capacitive element that has one end thereof connected to the first electrode of the second transistor;
   wherein, a first state is a state in which by setting the second control signal to be at a second intermediate voltage level, thereby employing the third transistor as a constant current load, a first electric signal which changes in a linear manner in accordance with an integration value of the amount of the incident light in an entire range of luminance is outputted from a pixel; and
   a second state is a state in which by setting the first control signal to be at an intermediate voltage level, thereby operating the first and the second transistors in a sub-threshold region, a second electric signal which changes in a natural logarithmic manner in accordance with a second integration value of the amount of the incident light at least in a part of a range of luminance is outputted from the pixel.

2. A solid state image sensing device as descried in claim 1:
   wherein, when an image sensing operation is performed in the first state, the first transistor is employed as a transistor for resetting the charge-holding portion so as to have the first control signal serve as a first signal having two voltage levels without using the intermediate voltage level among three voltage levels; and
   when the image sensing operation is performed in the second state, the third transistor is employed as a transistor for resetting the capacitive element so as to have the second control signal serve as a second signal having two voltage levels without using the second intermediate voltage level among three voltage levels.

3. A solid state image sensing device as described in claim 1, further comprising:
   an output signal line that is connected to the pixel and has an electric signal outputted from the pixel; and
   the pixel further comprising:
   an amplification portion that amplifies the electric signal appearing to the capacitive element; and
   a reading-out switch that is connected to the output signal line and outputs the electric signal being amplified in the amplification portion to the output signal line.

4. A solid state image sensing device as described in claim 1:
   wherein, the image sensing operation for each frame is selected and changed over between the first state and the second state.

* * * * *

UNITED STATES PATENT AND TRADEMARK OFFICE
CERTIFICATE OF CORRECTION

PATENT NO.            : 7,663,683 B2                                          Page 1 of 1
APPLICATION NO.  : 11/879699
DATED                    : February 16, 2010
INVENTOR(S)          : Shigehiro Miyatake It is certified that error appears in the above-identified patent and that said Letters Patent is hereby corrected as shown below:

Column 18:
Line 28 claim 2, delete "descried" and insert -- described --.

Signed and Sealed this

Sixth Day of April, 2010

David J. Kappos
*Director of the United States Patent and Trademark Office*